US012776478B2

(12) United States Patent
Kamata et al.

(10) Patent No.: US 12,776,478 B2
(45) Date of Patent: Oct. 27, 2026

(54) PLASMA SOURCE AND PLASMA PROCESSING APPARATUS

(71) Applicant: Tokyo Electron Limited, Tokyo (JP)

(72) Inventors: Eiki Kamata, Yamanashi (JP); Kenta Kato, Yamanashi (JP); Taro Ikeda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 99 days.

(21) Appl. No.: 18/885,134

(22) Filed: Sep. 13, 2024

(65) Prior Publication Data

US 2025/0104972 A1 Mar. 27, 2025

(30) Foreign Application Priority Data

Sep. 27, 2023 (JP) ................................. 2023-166443

(51) Int. Cl.
*H01J 37/32* (2006.01)

(52) U.S. Cl.
CPC .... *H01J 37/32183* (2013.01); *H01J 37/3244* (2013.01)

(58) Field of Classification Search
None
See application file for complete search history.

(56) References Cited

U.S. PATENT DOCUMENTS 5,279,669 A * 1/1994 Lee ........................ B01J 19/126 118/723 MR
5,282,899 A * 2/1994 Balmashnov ..... H01J 37/32357 315/111.41
5,336,533 A * 8/1994 Balmashnov ..... H01J 37/32357 427/571
6,039,834 A * 3/2000 Tanaka .................. C23C 16/511 204/298.38
6,230,652 B1 * 5/2001 Tanaka .............. H01J 37/32192 118/723 ME
6,361,707 B1 * 3/2002 Tanaka .............. H01J 37/32192 438/726
7,183,514 B2 2/2007 Kamarehi
7,943,005 B2 * 5/2011 Kumar .............. H01J 37/32422 438/731
9,502,218 B2 * 11/2016 Chen ................. H01J 37/32422
9,548,187 B2 * 1/2017 Ikeda .................. H01J 37/3222
10,056,233 B2 * 8/2018 Chen ................. H01J 37/32422
10,224,186 B2 * 3/2019 Polak .................. H01J 37/3244

(Continued)

FOREIGN PATENT DOCUMENTS

JP 2006-516806 A 7/2006
JP 2014-049529 A 3/2014

(Continued)

*Primary Examiner* — Srinivas Sathiraju
(74) *Attorney, Agent, or Firm* — Fenwick & West LLP

(57) ABSTRACT

Provided is a plasma source comprising: a housing that defines a plasma generation space; a gas inlet port disposed in the housing to introduce a gas; a supply port disposed in the housing to supply active species of plasma produced from the gas in the plasma generation space; an ignition power supply port disposed in the housing to supply a radio-frequency (RF) power for igniting the plasma in the plasma generation space; and a maintenance power supply port disposed in the housing to supply the RF power for maintaining the plasma ignited in the plasma generation space.

16 Claims, 7 Drawing Sheets

(56) References Cited

U.S. PATENT DOCUMENTS

| | | | | |
|---|---|---|---|---|
| 11,164,725 | B2 * | 11/2021 | Zhang | H01J 37/321 |
| 11,164,742 | B2 * | 11/2021 | Yang | H10P 14/6514 |
| 11,817,291 | B2 * | 11/2023 | Mun | H01J 37/32091 |
| 2003/0152700 | A1 * | 8/2003 | Asmussen | C23C 16/0254 427/249.8 |
| 2004/0182834 | A1 | 9/2004 | Kamarehi | |
| 2008/0226840 | A1 * | 9/2008 | Asmussen | C23C 16/0254 977/891 |
| 2009/0255798 | A1 * | 10/2009 | Furuta | C23C 16/5096 118/723 I |
| 2013/0098551 | A1 * | 4/2013 | Dorf | H01J 37/32082 156/345.4 |
| 2014/0060572 | A1 | 3/2014 | Yasumuro et al. | |
| 2014/0158302 | A1 * | 6/2014 | Ikeda | H01J 37/32201 156/345.41 |
| 2014/0190632 | A1 * | 7/2014 | Kumar | H01J 37/32357 156/345.3 |
| 2015/0144265 | A1 | 5/2015 | Fujino et al. | |
| 2015/0221479 | A1 * | 8/2015 | Chen | H01J 37/32422 118/723 MP |
| 2015/0255258 | A1 * | 9/2015 | Nozawa | C23C 16/4584 118/723 MW |
| 2016/0268104 | A1 * | 9/2016 | Polak | H01J 37/32532 |
| 2016/0372306 | A1 * | 12/2016 | Voronin | H01J 37/3211 |
| 2017/0125220 | A1 * | 5/2017 | Chen | H01J 37/32422 |
| 2017/0301517 | A1 * | 10/2017 | Chen | H01J 37/32422 |
| 2019/0145005 | A1 * | 5/2019 | Outten | H01J 37/32422 427/569 |
| 2019/0378692 | A1 * | 12/2019 | Zhang | H01J 37/321 |
| 2021/0351005 | A1 * | 11/2021 | Kobayashi | H01J 37/32091 |
| 2022/0059321 | A1 * | 2/2022 | Zhang | H01J 37/321 |
| 2022/0115207 | A1 * | 4/2022 | Swiatnicki | H01J 37/32935 |
| 2022/0230839 | A1 * | 7/2022 | Mun | H01J 37/32651 |
| 2023/0043892 | A1 * | 2/2023 | Zong | C23C 16/26 |
| 2023/0081103 | A1 | 3/2023 | Kato et al. | |
| 2024/0420924 | A1 * | 12/2024 | Sahu | H01J 37/3244 |
| 2025/0095973 | A1 * | 3/2025 | Kaneko | H01J 37/32935 |
| 2025/0104972 | A1 * | 3/2025 | Kamata | H01J 37/32357 |
| 2025/0104977 | A1 * | 3/2025 | Ikeda | H01J 37/32082 |

FOREIGN PATENT DOCUMENTS

| | | | |
|---|---|---|---|
| KR | 10-2013-0127433 | A | 11/2013 |
| KR | 10-2023-0039536 | A | 3/2023 |
| WO | WO 2004/068559 | A2 | 8/2004 |

* cited by examiner

PLASMA SOURCE AND PLASMA PROCESSING APPARATUS

CROSS-REFERENCE TO RELATED APPLICATIONS

This application claims priority to Japanese Patent Application No. 2023-166443 filed on Sep. 27, 2023, the entire contents of which are incorporated herein by reference.

TECHNICAL FIELD

The present disclosure relates to a plasma source and a plasma processing apparatus.

BACKGROUND

For example, Japanese Laid-open Patent Publication No. 2014-49529 proposes a plasma processing apparatus including a remote plasma unit. The remote plasma unit is an inductively coupled plasma source, and defines a plasma generation space at the upper part of the plasma processing apparatus. The remote plasma unit has a coil surrounding the plasma generation space, and a radio frequency (RF) power supply for supplying an RF power is connected to the coil.

For example, Japanese Laid-open Patent Publication No. 2006-516806 provides a spiral coil coupled remote plasma generator using a spiral coil of a slow wave structure.

SUMMARY

This disclosure provides a technique capable of scaling down a plasma source.

In accordance with an aspect of the present disclosure, there is provided a plasma source comprising: a housing that defines a plasma generation space; a gas inlet port disposed in the housing to introduce a gas; a supply port disposed in the housing to supply active species of plasma produced from the gas in the plasma generation space; an ignition power supply port disposed in the housing to supply a radio-frequency (RF) power for igniting the plasma in the plasma generation space; and a maintenance power supply port disposed in the housing to supply the RF power for maintaining the plasma ignited in the plasma generation space.

DETAILED DESCRIPTION

Figure 1:
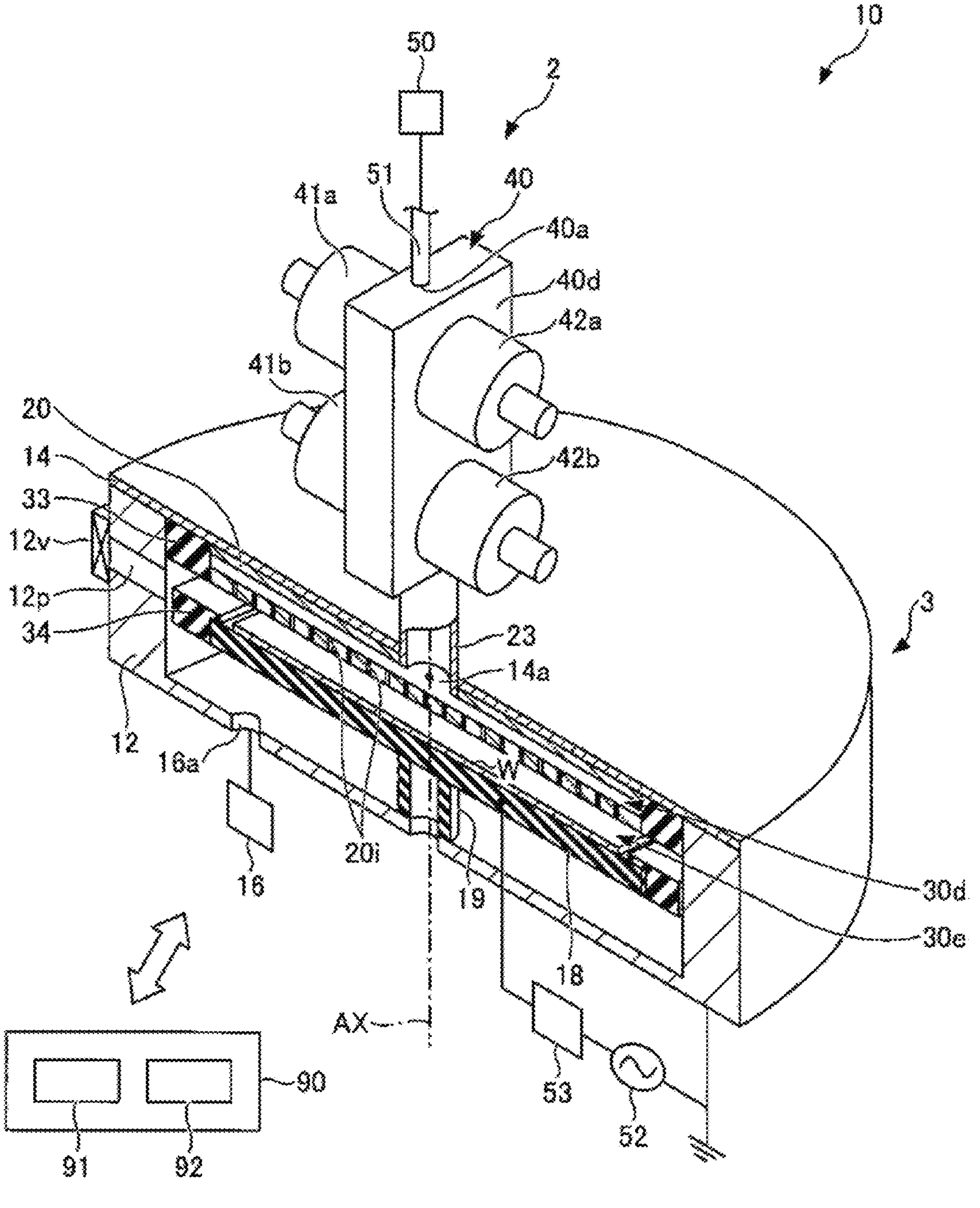
FIG. 1 is a cross-sectional perspective view showing an example of a plasma processing apparatus according to a first embodiment.

Hereinafter, the embodiment of the present disclosure will be described with reference to the accompanying drawings. Like reference numerals will be given to like parts throughout the drawings, and redundant description thereof may be omitted.

First Embodiment (Plasma Processing Apparatus)

A plasma processing apparatus 10 having a plasma source (remote plasma source) according to a first embodiment will be described with reference to FIG. 1. FIG. 1 is a cross-sectional view showing an example of a plasma processing apparatus 10 according to the first embodiment.

The plasma processing apparatus 10 shown in FIG. 1 includes a plasma source 2 and a processing chamber 3. The plasma source 2 has a housing 40. The housing 40 forms a flat hollow space centered on an axis AX. The plasma source 2 and the processing chamber 3 are connected by a connecting portion 23. A microwave (radio frequency (RF), electromagnetic wave) power and a gas are supplied into the housing 40, and plasma is produced from the gas by the electric field of the microwave power. The activated species in the produced plasma are supplied to the plasma processing chamber 30*e* in the processing chamber 3 via the connecting portion 23. The activated species transferred from the plasma source 2 to the plasma processing chamber 30*e* are dissociated again by the RF power applied to the processing chamber 3, for example, and are used to process the substrate W.

The plasma source 2, the connecting portion 23, and the processing chamber 3 have the axis AX as a center line. The axis AX is an axis extending in a vertical direction. In the present embodiment, the processing chamber 3 includes a chamber body 12. The chamber body 12 has a substantially cylindrical shape, and has an upper opening. The chamber body 12 provides a sidewall and a bottom portion of the processing chamber 3. The chamber body 12 is made of a metal such as aluminum or the like. The chamber body 12 is grounded.

The sidewall of the chamber body 12 provides a passage 12*p*. The substrate W is transferred between the inside of the processing chamber 3 and the outside of the processing chamber 3 through the passage 12*p*. The passage 12*p* can be opened and closed by a gate valve 12*v*. The gate valve 12*v* is disposed along the sidewall of the chamber body 12.

The processing chamber 3 further includes a ceiling wall 14. The ceiling wall 14 is made of a metal such as aluminum. The ceiling wall 14 closes the upper opening of the chamber body 12. The ceiling wall 14 is grounded together with the chamber body 12.

The bottom portion of the processing chamber 3 provides an exhaust port 16*a*. The exhaust port 16*a* is connected to an exhaust device 16. The exhaust device 16 includes a pressure controller including an automatic pressure control valve and a vacuum pump such as a turbo molecular pump.

The processing chamber 3 further includes a placing table 18. The placing table 18 is disposed in the processing chamber 3. The placing table 18 is configured to support the substrate W placed thereon. The substrate W is placed on the placing table 18 in a substantially horizontal state. The placing table 18 may be supported by a support member 19.

The support member 19 extends upward from the bottom portion of the processing chamber 3. The placing table 18 and the support member 19 may be made of a dielectric material such as aluminum nitride or the like.

The processing chamber 3 further includes a shower head 20. The shower head 20 is made of a metal such as aluminum or the like. The shower head 20 is formed in a substantially disc shape, and a hollow structure. The shower head 20 shares the axis AX as the center line thereof. The shower head 20 is disposed above the placing table 18 and under the ceiling wall 14.

The shower head 20 provides a diffusion space 30*d* therein. The shower head 20 has a plurality of gas holes 20*i* penetrating from the diffusion space 30*d* downward in the thickness direction of the shower head 20. The plurality of gas holes 20*i* are opened on the bottom surface of the shower head 20.

The placing table 18 is disposed below the shower head 20 to face the shower head 20. A gas is introduced from the diffusion space 30*d* into the plasma processing chamber 30*e* between the shower head 20 and the placing table 18 through the plurality of gas holes 20*i*. The placing table 18 also serves as a lower electrode, and the shower head 20 also serves as an upper electrode.

The shower head 20 is covered with a dielectric member 33 such as aluminum oxide or the like. The placing table 18 is covered with a dielectric member 34 such as aluminum oxide or the like. If the RF power is not applied to the shower head 20, the dielectric member 33 may not be provided. However, it is preferable to provide the dielectric member 33 in order to define the area of the shower head 20 that functions as the counter electrode of the placing table 18. Further, it is preferable to provide the dielectric member 33 in order to equalize the ratio of the anode and the cathode of the electrode.

A radio-frequency (RF) power supply 52 is connected to the placing table 18 via a matching device 53. The matching device 53 has an impedance matching circuit. The impedance matching circuit is configured to match the impedance on the load (plasma) side to the output impedance of the RF power supply 52. The frequency of the RF power supplied from the RF power supply 52 is lower than the frequency of VHF waves and microwaves supplied to the plasma source 2, and is 60 MHz or less. The frequency of the RF power may be 13.56 MHz. The RF power supply 52 may be connected to the shower head 20, and may supply the RF power to the shower head 20.

(Plasma Source)

Figure 2:
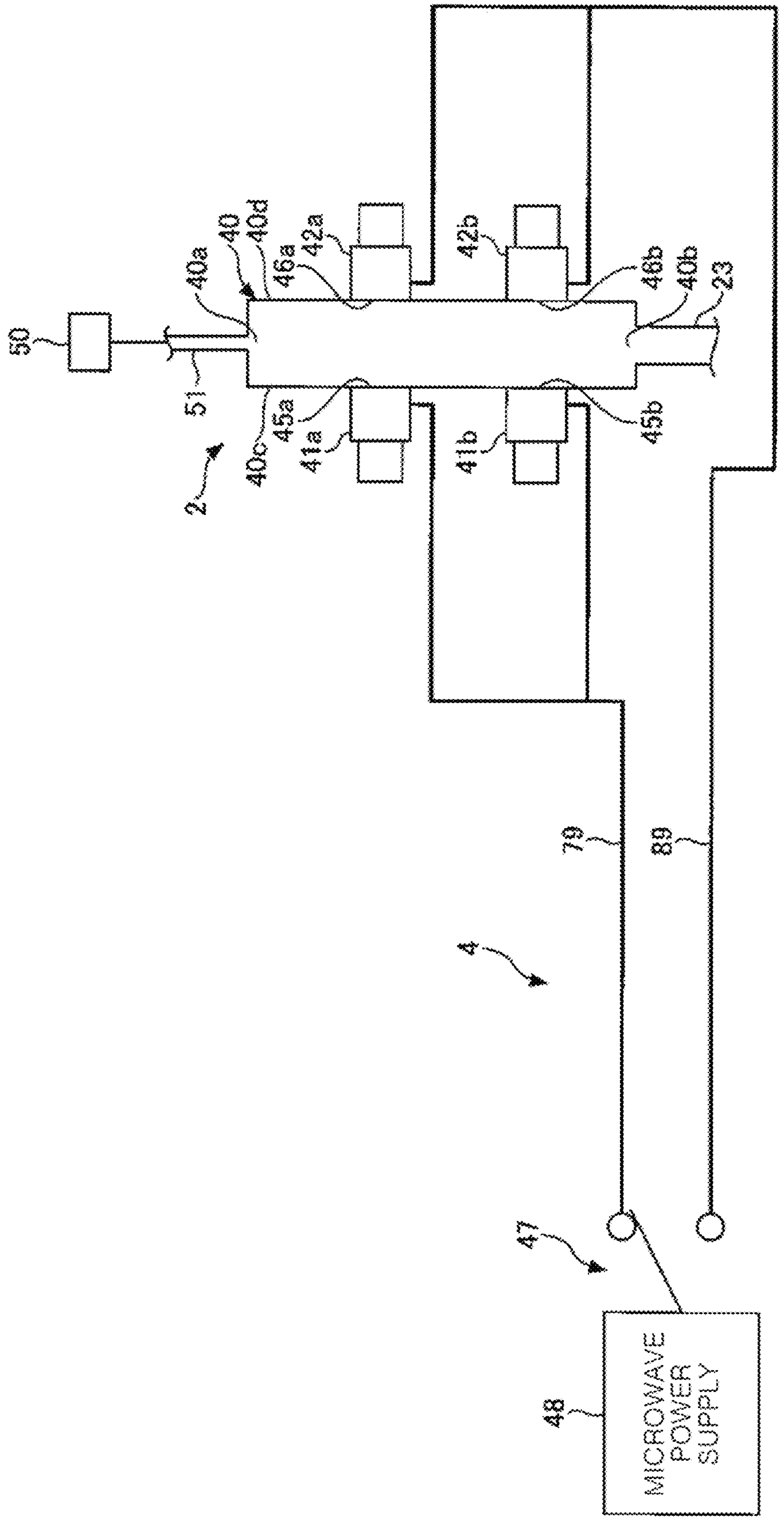
FIG. 2 shows an example of connection between a microwave power supply and a plasma source according to the first embodiment.

The plasma source 2 is disposed on the ceiling wall 14 of the processing chamber 3. FIG. 2 shows an example of connection between a microwave power supply 48 and the plasma source 2 according to the first embodiment.

As shown in FIGS. 1 and 2, the plasma source 2 has the housing 40. The housing 40 has a gas inlet port 40*a*, a supply port 40*b*, ignition power supply ports 45*a* and 45*b*, and maintenance power supply ports 46*a* and 46*b*.

Figure 3:
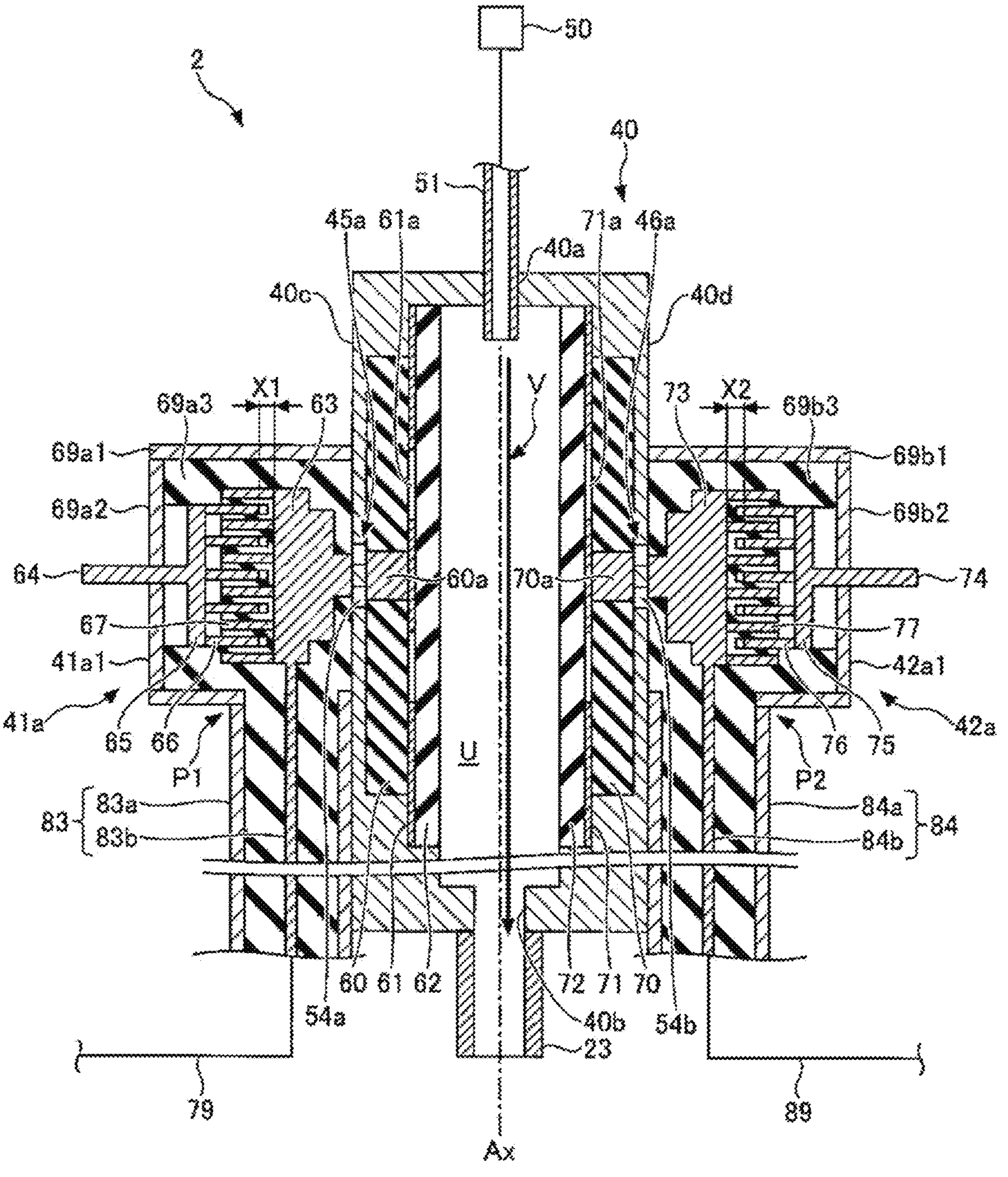
FIG. 3 is a longitudinal cross-sectional view showing an example of a configuration of the plasma source according to the first embodiment.

FIG. 3 is an enlarged cross-sectional view of an upper half of the plasma source 2 according to the first embodiment. As shown in FIG. 3, the housing 40 forms a hollow rectangular space, and defines a plasma generation space U therein. The housing 40 has a gas inlet port 40*a* on the upper surface thereof and a supply port 40*b* on the bottom surface thereof. A gas nozzle 51 penetrates through the gas inlet port 40*a*, and the tip end thereof is inserted into the housing 40. The gas nozzle 51 is connected to a gas supply source 50, and supplies a gas supplied from the gas supply source 50 into the housing 40.

The plasma source 2 is connected to the ceiling wall 14 of the processing chamber 3 via the connecting portion 23. The connecting portion 23 shares the axis AX as the center line thereof. The connecting portion 23 is a cylindrical annular member, and is made of a metal such as aluminum or the like.

The upper end of the connecting portion 23 is connected to the housing 40 at the bottom surface of the housing 40, and communicates with the supply port 40*b*. The lower end of the connecting portion 23 is fixed to the ceiling wall 14 to communicate with a through-hole 14*a* formed at the center of the upper surface of the ceiling wall 14 of the processing chamber 3. The supply port 40*b* is an opening formed at the housing 40 to supply the active species of the plasma produced in the plasma generation space U to the downstream side, i.e., to the plasma processing chamber 30*e* side. The active species in the plasma produced in the plasma generation space U in the plasma source 2 are supplied to the plasma processing chamber 30*e* of the processing chamber 3 via the connecting portion 23 and the through-hole 14*a*.

The housing 40 is made of a metal such as aluminum or the like, and has a ground potential. As shown in FIGS. 1 and 2, the plasma source 2 has the ignition power supply ports 45*a* and 45*b* on a side surface 40*c* of the housing 40 that has a larger area, and the maintenance power supply ports 46*a* and 46*b* on a side surface 40*d* opposite to the side surface 40*c*.

The ignition power supply ports 45*a* and 45*b* are arranged vertically on the side surface 40*c* of the housing 40. First resonators 41*a* and 41*b* are attached to the ignition power supply ports 45*a* and 45*b*, respectively. The first resonators 41*a* and 41*b* are configured to adjust the structural heights of the first resonators 41*a* and 41*b*, which will be described later, so that the frequency of the microwave power becomes an appropriate frequency (resonance frequency) for igniting the plasma. Accordingly, the microwave power for igniting the plasma can be supplied from the ignition power supply ports 45*a* and 45*b* to the plasma generation space U.

The maintenance power supply ports 46*a* and 46*b* are arranged vertically on the side surface 40*d* of the housing 40. Second resonators 42*a* and 42*b* are attached to the maintenance power supply ports 46*a* and 46*b*, respectively. The second resonators 42*a* and 42*b* are configured to adjust the structural heights of the second resonators 42*a* and 42*b*, which will be described later, so that the frequency of the microwave power becomes an appropriate frequency (resonance frequency) for maintaining the plasma after ignition. Accordingly, the microwave power for maintaining the plasma can be supplied from the maintenance power supply ports 46*a* and 46*b* to the plasma generation space U.

In the housing 40, the gas inlet port 40*a* is set as the upstream side, and the supply port 40*b* is set as the downstream side. The gas flows from the upstream side to the downstream side. Therefore, the ignition power supply ports 45*a* and 45*b* and the maintenance power supply ports 46*a* and 46*b* are disposed on a path V that connects the gas inlet port 40*a* and the supply port 40*b*. The ignition power supply ports 45*a* and 45*b* are also collectively referred to as "ignition power supply port 45." The maintenance power supply ports 46*a* and 46*b* are also collectively referred to as "maintenance power supply port 46." The first resonators 41*a* and 41*b* are also collectively referred to as "first resonator 41." The second resonators 42*a* and 42*b* are also collectively referred to as "second resonator 42."

Although the number of ignition power supply ports 45 and the number of first resonators 41 need to meet the number required to ignite plasma, the number of maintenance power supply ports 46 and the number of second resonators 42 need to meet the number required to maintain plasma. Therefore, the number of ignition power supply ports 45 and the number of first resonators 41 may be different from the number of maintenance power supply ports 46 and the number of second resonators 42.

The first resonators 41*a* and 41*b* are attached to the ignition power supply ports 45*a* and 45*b*, respectively. Although the plurality of ignition power supply ports 45*a* and 45*b* and the plurality of first resonators 41*a* and 41*b* are provided in the present embodiment, the present disclosure is not limited thereto. The number of ignition power supply port 45 and the number of first resonator 41 may be one or may be two or more as long as they can ignite plasma from the gas supplied to the plasma generation space U and produce initial plasma. Since, however, the first resonator 41 is used for a short period of time at the time of igniting plasma, it is sufficient to provide one first resonator 41 on the path V as long as the plasma can be ignited. In other words, it is preferable to provide the minimum number of first resonators 41 for igniting plasma because they are used instantaneously at the time of igniting plasma.

The second resonators 42*a* and 42*b* are attached to the maintenance power supply ports 46*a* and 46*b*, respectively. Although the plurality of maintenance power supply ports 46*a* and 46*b* and the plurality of second resonators 42*a* and 42*b* are provided in the present embodiment, the present disclosure is not limited thereto. The number of maintenance power supply port 46 and the number of second resonator 42 may be one or may be two or more as long as the plasma ignited in the plasma generation space U can be maintained. However, the plurality of second resonators 42 may be provided on the path V, because there are used to maintain the plasma. If the ignited plasma does reach the supply port 40*b* with one second resonator 42 for maintaining plasma, it is preferable to provide two or more second resonators 42 for maintaining plasma on the path V that connects the gas inlet port 40*a* and the supply port 40*b*. In other words, a sufficient number of maintenance power supply ports 46 for maintaining plasma and a sufficient number of second resonators 42 for maintaining plasma are provided in order to supply a power required for plasma processing.

In the present embodiment, the ignition power supply port 45 and the maintenance power supply port 46 are disposed at opposing positions of the side surfaces 40*c* and 40*d* of the housing 40. The ignition power supply port 45*a* and the maintenance power supply port 46*a* are disposed at opposing positions, and the ignition power supply port 45*b* and the maintenance power supply port 46*b* are disposed at opposing positions. Accordingly, the plasma produced near the ignition power supply port 45 by the RF power supplied from the ignition power supply port 45 using the first resonator 41 can be efficiently maintained by the RF power supplied from the maintenance power supply port 46 using the second resonator 42.

However, the ignition power supply port 45 and the maintenance power supply port 46 are not necessarily disposed at opposing positions. For example, one ignition power supply port 45 may be disposed on the side surface 40*c* of the housing 40, and the plurality of maintenance power supply ports 46 may be disposed on the side surface 40*d*.

The first resonator 41 and the second resonator 42 have a comb teeth shape, and have the same basic structure. The first resonator 41 adjusts the structural height (see X1 in FIG. 3) of the first resonator 41 so that the frequency of the microwave power becomes an appropriate frequency (resonant frequency) for igniting plasma. The second resonator 42 adjusts the structural height (see X2 in FIG. 3) of the second resonator 42, which will be described later, so that the frequency of the microwave power becomes an appropriate frequency (resonant frequency) for maintaining plasma. As will be described later, the structural height X1 adjusted by the first resonator 41 is different from the structural height X2 adjusted by the second resonator 42. Hereinafter, the first resonator 41*a*, the second resonator 42*a*, and neighboring structures thereof shown in FIG. 3 will be described. The first resonator 41*a* and the second resonator 42*a* are comb teeth-shaped resonators having comb teeth-shaped fins. The first resonator 41*a* and the second resonator 42*a* shown in FIG. 3 have the same dimensions, such as the width and the length of the comb teeth.

The first resonator 41*a* and the neighboring structure thereof will be described. A disc-shaped quartz member 60, a disc-shaped slot antenna 61, and a disc-shaped dielectric 62 are arranged in that order to be adjacent to the inner surface of the housing 40 on the side surface 40*c* side. The quartz member 60, the slot antenna 61, and the dielectric 62 share a common central axis. The quartz member 60 is disposed in a recess formed on the inner surface of the housing 40. The dielectric 62 is made of, e.g., alumina or aluminum nitride, and faces the plasma generation space U. The slot antenna 61 is held between the quartz member 60 and the dielectric 62. The diameter of the quartz member 60 is smaller than the diameters of the slot antenna 61 and the dielectric 62. The diameters of the slot antenna 61 and the dielectric 62 are the same.

A power feed part 60*a* of a conductor is embedded in the through-hole at the center of the quartz member 60. The slot antenna 61 is a thin metal plate disposed between the quartz member 60 and the dielectric 62, and has a ring-shaped slot 61*a* (space).

A waveguide 83 has a coaxial structure including an outer conductor 83*a* and an inner conductor 83*b*, and the space between the outer conductor 83*a* and the inner conductor 83*b* is filled with a dielectric a dielectric material such as poly tetra fluoro ethylene (PTFE). The waveguide 83 is connected to a cable 79. The cable 79 is connected to the microwave power supply 48, and guides the microwaves outputted from the microwave power supply 48 to the first resonator 41*a* via the waveguide 83 (see FIG. 2).

A housing 41*a*1 of the first resonator 41*a* has a cylindrical side portion 69*a*1 and an end portion 69*a*2. The cylindrical side portion 69*a*1 and the end portion 69*a*2 are made of a metal such as aluminum or the like. A part of the outer conductor 83*a* serves as the housing 41*a*1 of the first resonator 41*a*, and the housing 41*a*1 is kept at ground potential together with the grounded processing chamber 3. Further, a portion 69*a*3 except a movable range of a ground fin 65 in the housing 41*a*1 is filled with a dielectric such as PTFE.

The outer conductor 83*a* has a cylindrical shape, and an input port P1 is formed on the side portion 69*a*1 of the first resonator 41*a*. In the outer conductor 83*a*, the ignition power supply port 45*a*, which functions as an output port, is formed at the end of the cylindrical part near the side where the input port P1 is formed, and the end portion 69*a*2 is formed in a click shape to close the cylindrical part. A rod-shaped portion 64 for moving the ground fin 65 in the left-right direction in FIG. 3 penetrates through the center of the end portion 69*a*2.

The ground fin 65 is disposed in the housing 41*a*1. The ground fin 65 has a plurality of fins 66 and the rod-shaped portion 64. The plurality of fins 66 and the rod-shaped portion 64 are made of a conductor such as aluminum or the like. The plurality of fins 66 have a concentric columnar shape and cylindrical shape, for example. Further, the first resonator 41*a* is a comb-shaped resonator in which the plurality of fins 66 have a comb-shaped cross section shown in FIG. 3.

A plurality of fins 67 are provided in the housing 41*a*1. The plurality of fins 67 are multipole antennas which have a structure with three concentric cylinders. The plurality of fins 67 have a comb-shaped cross section shown in FIG. 3.

The side surfaces of the plurality of fins 67 are fixed to a cylindrical base 63. The fins 67 and the base 63 are made of a conductor such as aluminum or the like. The ground fin 65 is slidable. Even when the ground fin 65 is inserted deepest into the fin 67, the ground fin 65 is not brought into contact with the fins 67. By sliding the ground fin 65, the insertion amount of the fins 66 with respect to the fins 67 is changed. By changing the insertion amount of the ground fin 65 (the fins 66) to change the dimension of the resonance space, the resonance frequency of the microwave power passing through the first resonator 41*a* can be controlled to an appropriate resonance frequency for igniting plasma.

As shown in FIG. 3, the gap from the tip ends of the plurality of fins 66 to the surface of the base 63 to which the plurality of fins 67 are fixed is defined as X1. The gap from the tip ends of the plurality of fins 67 to the surface of the ground fin 65 to which the plurality of fins 66 are fixed may be defined as X1.

An alumina ring member 54*a* is disposed near the ignition power supply port 45*a* to be fitted into a cutout portion of the housing 40. The ring member 54*a* is adjacent to the power feed part 60*a* of a conductor. The ring member 54*a* functions as the ignition power supply port 45*a*. The microwave power passes through a connection portion (not shown), the first resonator 41*a*, the power feed part 60*a*, the slot antenna 61 (the slot 61*a*), transmits through the dielectric 62, and is supplied into the housing 40.

Accordingly, the gas introduced from the gas inlet port 40*a* is decomposed by the energy of the microwaves, and plasma is ignited in the plasma generation space U, thereby generating initial plasma. By providing the ignition power supply port 45*a* and the first resonator 41*a* on the path V that connects the gas inlet port 40*a* and the supply port 40*b*, the plasma can be efficiently ignited in the plasma generation space U.

Next, the second resonator 42*a* and the neighboring structure thereof will be described. A disc-shaped quartz member 70, a disc-shaped slot antenna 71, and a disc-shaped dielectric 72 are arranged in that order to be adjacent to the inner surface of the housing 40 on the side surface 40*d* side. The quartz member 70, the slot antenna 71, and the dielectric 72 share a common central axis. The quartz member 70 is disposed in a recess formed on the inner surface of the housing 40. The dielectric 72 is made of, e.g., alumina or aluminum nitride, and faces the plasma generation space U. The slot antenna 71 is held between the quartz member 70 and the dielectric 72. The diameter of the quartz member 70 is smaller than the diameters of the slot antenna 71 and the dielectric 72. The diameters of the slot antenna 71 and the dielectric 72 are the same.

A power feed part 70*a* of a conductor is embedded in the through-hole at the center of the quartz member 70. The slot antenna 71 is a thin metal plate disposed between the quartz member 70 and the dielectric 72, and has a ring-shaped slot 71*a* (space).

The waveguide 84 has a coaxial structure including an outer conductor 84*a* and an inner conductor 84*b*, and the space between the outer conductor 84*a* and the inner conductor 84*b* is filled with a dielectric such as PTFE. The waveguide 84 is connected to a cable 89. The cable 89 is connected to the microwave power supply 48 and guides the microwaves outputted from the microwave power supply 48 to the second resonator 42*a* (see FIG. 2).

A housing 42*a*1 of the second resonator 42*a* has a cylindrical side portion 69*b*1 and an end portion 69*b*2. The cylindrical side portion 69*b*1 and the end portion 69*b*2 are made of a metal such as aluminum or the like. A part of the outer conductor 84*a* serves as the housing 42*a*1 of the second resonator 42*a*, and the housing 42*a*1 is kept at ground potential together with the grounded processing chamber 3. Further, a portion 69*b*3 except a movable range of a ground fin 75 in the housing 42*a*1 is filled with a dielectric such as PTFE.

The outer conductor 84*a* has a cylindrical shape, and an input port P2 is formed on the side portion 69*b*1 of the second resonator 42*a*. In the outer conductor 84*a*, the maintenance power supply port 46*a* that functions as an output port is formed at the end portion of the cylindrical part near the side where the input port P2 is formed, and the other end 69*b*2 is formed in a disc shape to close the cylindrical part. A rod-shaped portion 74 for moving the ground fin 75 in the left-right direction in FIG. 3 penetrates through the center of the end portion 69*b*2.

The ground fin 75 is disposed in the housing 42*a*1. The ground fin 75 has a plurality of fins 76 and a rod-shaped portion 74. The plurality of fins 76 and the rod-shaped portion 74 are made of a conductor such as aluminum or the like. The plurality of fins 76 have a concentric columnar shape and cylindrical shape, for example. Further, the second resonator 42*a* is a comb-shaped resonator in which the fins 76 have a comb-shaped cross section shown in FIG. 3.

A plurality of fins 77 are disposed in the housing 42*a*1. The fins 77 are multipole antennas which have a structure with three concentric cylinders. The fins 77 have a comb-shaped cross section shown in FIG. 3.

The side surfaces of the fins 77 are fixed to a cylindrical base 73. The fins 77 and the base 73 are made of a conductor such as aluminum or the like. The ground fin 75 is slidable. Even when the ground fin 75 is inserted deepest into the fins 77, the ground fin 75 is not brought into contact with the fins 77. The insertion amount of the fins 76 into the fins 77 is changed by sliding the ground fin 75. By changing the insertion amount of the ground fin 75 (the fins 76) to change the dimension of the resonance space, the resonance frequency of the second resonator 42*a* can be controlled to coincide with the frequency of the microwave, which makes it possible to maintain and control the plasma.

As shown in FIG. 3, the gap from the tip ends of the fins 76 to the surface of the base 73 to which the fins 77 are fixed is defined as X2. The gap from the tip ends of the fins 77 to the surface of the ground fin 75 to which the fins 76 are fixed may be defined as X2.

A ring member 54*b* made of alumina is disposed near the maintenance power supply port 46*a* to be fitted into a cutout portion of the housing 40. The ring member 54*b* is adjacent to the power feed part 70*a* of a conductor. The ring member 54*b* functions as the maintenance power supply port 46*a*. The microwave power passes through a connection part (not shown), the second resonator 42*a*, the power feed part 70*a*, and the slot antenna 71 (the slot 71*a*), transmits through the dielectric 72, and is supplied into the housing 40.

Accordingly, the gas introduced from the gas inlet port 40*a* is decomposed by the energy of the microwaves, and the plasma is maintained in the plasma generation space U. By providing the maintenance power supply port 46*a* and the second resonator 42*a* on the path V that connects the gas inlet port 40*a* and the supply port 40*b*, it is possible to efficiently maintain the plasma in the plasma generation space U.

The first resonator 41*b* has the same structure as that of the first resonator 41*a*, and the second resonator 42*b* has the same structure as that of the second resonator 42*a*. Therefore, the description thereof will be omitted.

Next, an example of the connection between the plasma source 2 and the microwave power supply 48 will be described with reference to FIG. 2. The plasma source 2 has the power supply part 4. The power supply part 4 has the microwave power supply 48, a switching part 47, and the cables 79 and 89. The first resonators 41*a* and 41*b* are connected to the microwave power supply 48 via the cable 79. The second resonators 42*a* and 42*b* are connected to the microwave power supply 48 via the cable 89.

The switching part 47 switches electrical connection between the ignition power supply ports 45*a* and 45*b* and the first resonators 41*a* and 41*b* and the microwave power supply 48, and the electrical connection between the maintenance power supply ports 46*a* and 46*b* and the second resonators 42*a* and 42*b* and the microwave power supply 48.

At the time of igniting the plasma, the switching part 47 connects the microwave power supply 48 to the first resonators 41*a* and 41*b* via the cable 79. At the time of maintaining the plasma, the switching part 47 connects the microwave power supply 48 to the second resonators 42*a* and 42*b* via the cable 89. Accordingly, one microwave power supply 48 can be used to supply the microwave power to the first resonators 41*a* and 41*b* at the time of igniting plasma, and to supply the microwave power to the second resonators 42*a* and 42*b* at the time of maintaining plasma.

The microwave power supply 48, which is an example of the RF power supply that supplies an RF power, is a fixed frequency power supply, not a variable frequency power supply. The microwave frequency band ranges from 300 MHz to 300 GHz. The RF power supply may include VHF waves with a frequency band of 150 MHz to 300 MHz. In other words, the RF power supply supplies an RF power including microwaves and VHF waves. In this specification, the fixed frequency power supply includes not only an RF output power supply with a single frequency, but also an output power supply that can vary a frequency in a narrow band of about +10 MHz to +20 MHz from the single frequency, and the fixed frequency power supply according to the present embodiment includes an output power supply that can vary such a narrow band frequency. In other words, a power supply that can both ignite and maintain plasma by switching the output frequency is defined as a variable frequency power supply, and a narrow-band power supply that can only ignite or maintain plasma is defined as a fixed frequency power supply.

With such a configuration, without using a large matching device, the plasma source 2 can be scaled down using the comb-shaped first and second resonators 41 and 42. Accordingly, it is possible to ignite and maintain the plasma by the scaled-down plasma source 2, and send the active species in the plasma to the processing chamber 3.

The matching device performs both impedance matching at the time of igniting plasma and impedance matching at the time of maintaining plasma. The impedance to be matched at the time of igniting plasma is quite different from the impedance to be matched at the time of maintaining plasma. Therefore, in the case of performing both impedance matching, the matching device circuit needs to be scaled up, and the cost also increases.

Figure 4:
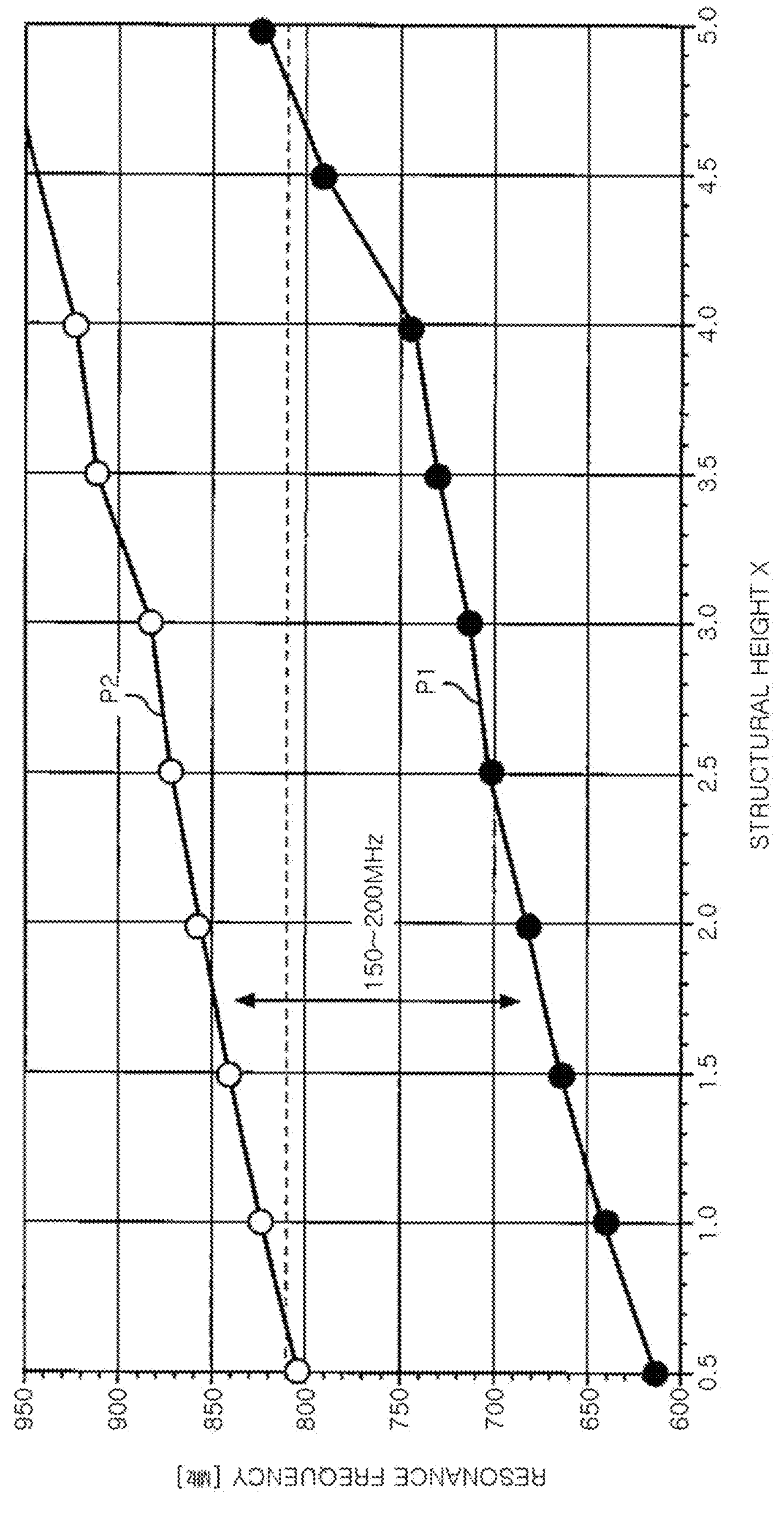
FIG. 4 shows an example of relationship between a structural height and a resonant frequency at the time of igniting plasma and at the time of maintaining plasma.

FIG. 4 shows an example of the relationship between the structural height and the resonant frequency at the time of igniting plasma and at the time of maintaining plasma. In the horizontal axis of FIG. 4, X represents the gap indicated by the structural heights X1 and X2 (mm) of the first resonator 41 and the second resonator 42 shown in FIG. 3. The vertical axis of FIG. 4 represents the resonant frequency (MHz).

A line P1 indicates the resonant frequency at which plasma can be ignited for the structural height X and the efficiency of supplying a microwave power of a specific frequency at the time of igniting plasma. A line P2 indicates the resonant frequency at which plasma can be maintained for the structural height X and the efficiency of supplying a microwave power of a specific frequency at the time of maintaining plasma is highest.

According to the above, when the structural height X is the same, the resonant frequency at the time of igniting plasma and the resonant frequency at the time of maintaining plasma are different from each other by about 150 MHz to 200 MHz. Therefore, if the plasma ignition and the plasma maintenance are performed using the same resonator, the difference between the structural height X at the time of igniting plasma and the structural height X at the time of maintaining plasma becomes large, which makes it impossible to fabricate a resonator structurally or achieve scaling down thereof.

On the other hand, it is difficult technically to use a variable frequency power supply that variably controls a band from 150 MHz to 200 MHz as the microwave power supply 48. In that case, the microwave power supply 48 becomes large in size and expensive, which is not realistic.

Therefore, in the plasma source 2 according to the present embodiment, the first resonator 41 for igniting plasma and the second resonator 42 for maintaining plasma are separately prepared, and microwaves of a single frequency are supplied by two different resonators.

For example, when the frequency of the microwaves outputted from the microwave power supply 48 is a single frequency of 810 MHz as indicated by the dotted line in FIG. 4, the structural height X1 of the first resonator 41*a* is adjusted to 4.8 mm, and the structural height X2 of the second resonator 42*a* is adjusted to 0.5 mm.

In this manner, the structural height X1 of the first resonator 41 and the structural height X2 of the second resonator 42 are adjusted to the appropriate structural height X that is the resonant frequency. By separately preparing the first resonator 41 for igniting plasma and the second resonator 42 for maintaining plasma, the first resonator 41 and the second resonator 42 can be further scaled down, and the cost reduction can be achieved. Further, the first resonator 41 and the second resonator 42 can be scaled down because they have semi-fixed resonance frequencies, that is, they are semi-fixed such that the positions of the comb teeth are adjusted by screws. For example, the first resonator 41 and the second resonator 42 can be scaled down to about ¼ the size of a conventional matching device.

The first resonator 41 and the second resonator 42 may have the same structure, and only the structural height X of the comb teeth shape may be adjusted. Further, the first resonator 41 and the second resonator 42 may be optimized for ignition and maintenance by optimizing the dimensions such as the width and length of the comb teeth shape of each resonator, and then adjusting the structural height X of the comb teeth shape.

Modification 1

A modification of the plasma source 2 according to the first embodiment will be described with reference to FIG. 5. The difference from the plasma source 2 according to the first embodiment shown in FIG. 2 is that the first resonator 41 in FIG. 2 is replaced with an antenna including a matching device 80, and the other configurations are the same. Therefore, the antenna including the matching device 80 will be described, and the description of the other configurations will be omitted.

In the plasma source 2 of the modification, an antenna part including the matching device 80 for ignition that can match a frequency over a relatively wide band is used. In the modification, the matching device 80 configured to ignite plasma is attached to the ignition power supply port 45.

The antenna part has the matching device 80 for matching an impedance and a radiation part 85 for radiating microwaves into the housing 40. Further, the antenna part has a cylindrical main container 87 made of a metal material and extending horizontally, and an inner conductor 88 extending in the main container 87 in the same direction as the extension direction of the main container 87. The main container 87 and the inner conductor 88 constitute a coaxial tube. The main container 87 has a cylindrical shape and constitutes the outer conductor of the coaxial tube. The inner conductor 88 has a rod shape or a cylindrical shape. The space between the inner circumferential surface of the main container 87 and the outer circumferential surface of the inner conductor 88 serve as a microwave transmission path 82.

In the microwave transmission path 82, a plurality of ring-shaped dielectrics 86 through which the inner conductor 88 penetrates are arranged. The dielectrics 86 are made of ceramic or the like, and are connected to a motor (not shown). The dielectrics 86 move to the left side and the right side in the microwave transmission path 82 by driving the motor. Accordingly, the matching device 80 performs impedance matching at the time of igniting plasma.

In the plasma source 2 according to the modification, the antenna part including the matching device 80 is used at the time of igniting plasma, and the second resonator 42 is used at the time of maintaining plasma. In other words, at the time of igniting plasma, the switching part 47 connects the microwave power source 48 and the antenna part including the matching device 80 via the cable 79. At the time of maintaining plasma, the switching part 47 connects the microwave power supply 48 and the second resonators 42*a* and 42*b* via the cable 89. Accordingly, it is possible to use one microwave power supply 48 to supply a microwave power to the antenna part including the matching device 80 at the time of igniting plasma, and to supply a microwave power to the second resonators 42*a* and 42*b* at the time of maintaining plasma. Hence, although the antenna part including the matching device 80 becomes larger compared to the first resonator 41, it is only required to match the impedance at the time of igniting plasma. In other words, it is not necessary to match the impedance at the time of maintaining plasma, which makes it possible to achieve scaling down and cost reduction. As a result, the plasma source 2 can be scaled down.

Second Embodiment (Plasma Processing Apparatus)

Figure 6:
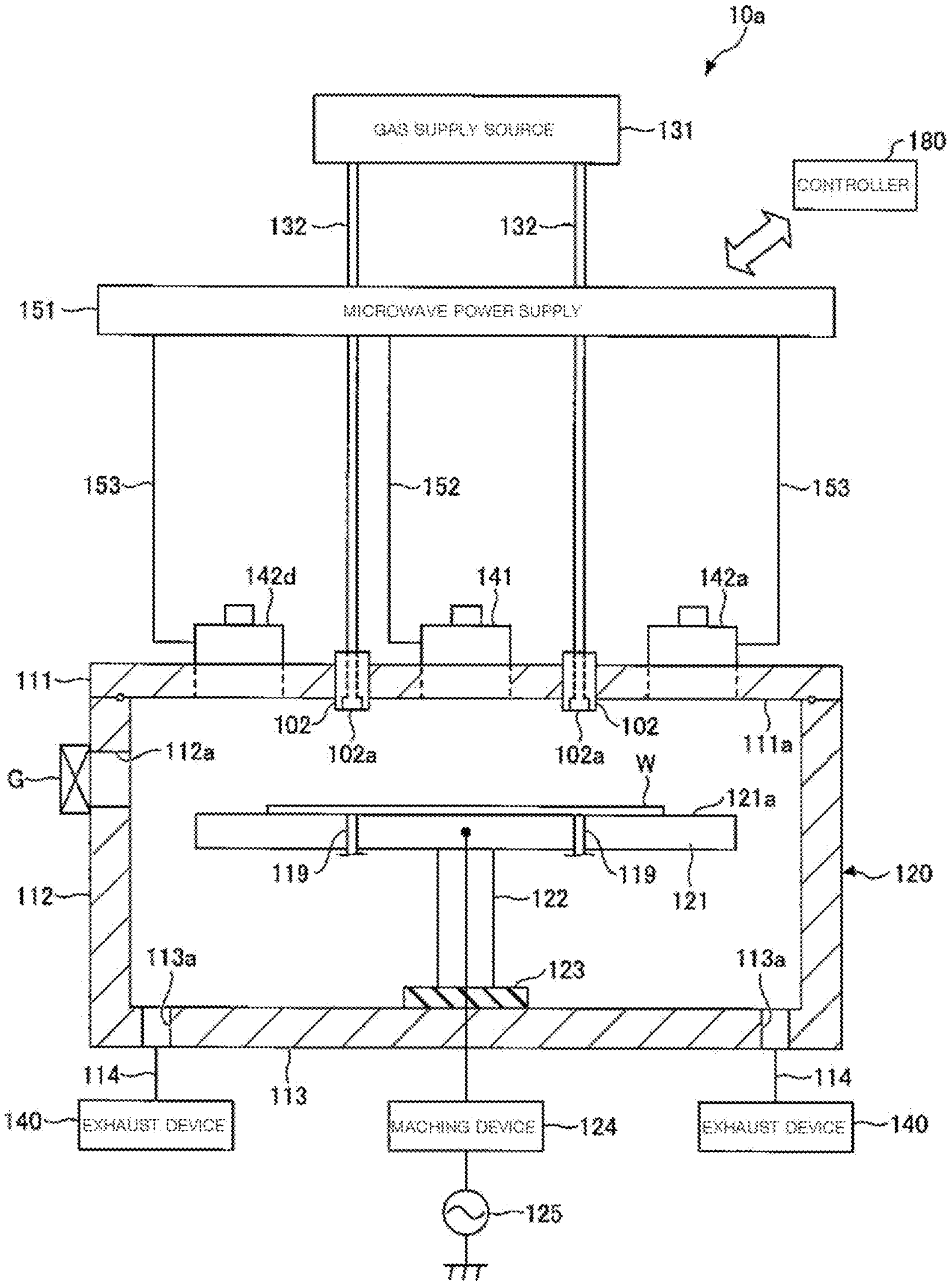
FIG. 6 is a cross-sectional perspective view showing an example of a plasma processing apparatus according to a second embodiment.
Figure 7:
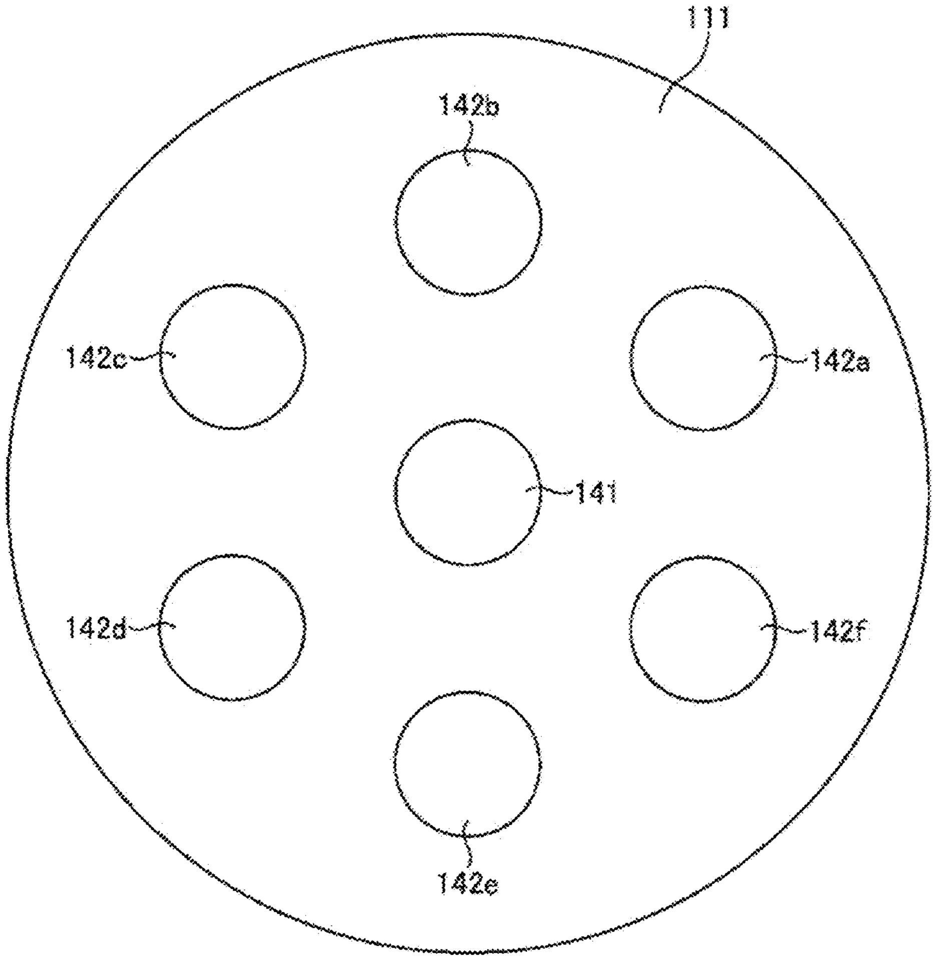
FIG. 7 shows a ceiling surface of the plasma processing apparatus according to the second embodiment.

A plasma processing device 10*a* according to a second embodiment will be described with reference to FIGS. 6 and 7. FIG. 6 is a cross-sectional perspective view showing an example of the plasma processing device 10*a* according to the second embodiment. FIG. 7 shows a ceiling surface of the plasma processing device 10*a* according to the second embodiment.

The plasma processing apparatus 10*a* shown in FIGS. 6 and 7 includes a chamber 120, a placing table 121, a gas supply source 131, an exhaust device 140, a first resonator 141, second resonators 142*a* to 142*f*, and a controller 180. The chamber 120 accommodates a substrate W as an example of a wafer. The placing table 121 is disposed in the chamber 120, and has a placing surface 121*a* on which the substrate W is placed. The gas supply source 131 supplies a gas into the chamber 120. The exhaust device 140 exhausts the chamber 120 to a depressurized state. The first resonator 141 and the second resonators 142*a* to 142*f* introduce microwaves, so that plasma is produced from the gas supplied into the chamber 120. The controller 180 controls the components of the plasma processing apparatus 10*a*. The second resonators 142*a* to 142*f* are also collectively referred to as “second resonator 142.”

The chamber 120 has a cylindrical shape, for example. The chamber 120 is made of, e.g., a metal material such as aluminum or an alloy thereof. The chamber 120 has a plate-shaped ceiling wall 111, a bottom wall 113, and a sidewall 112 that connects the ceiling wall 111 and the bottom wall 113. The ceiling wall 111, which is a conductive member, is disposed at the upper part of the chamber 120, and has a plurality of openings. The first resonator 141 and the second resonators 142*a* to 142*f* are disposed at the upper part of the ceiling wall 111 of the chamber 120, and supply a microwave power to the chamber 120.

The sidewall 112 has a loading/unloading port 112*a* for loading/unloading the substrate W between the chamber 120 and a transfer chamber (not shown) adjacent to the chamber 120. A gate valve G is disposed between the chamber 120 and the transfer chamber (not shown). The gate valve G has a function of opening and closing the loading/unloading port 112*a*. When the gate valve G is closed, the chamber 120 is airtightly sealed. When the gate valve G is opened, the substrate W is transferred between the chamber 120 and the transfer chamber.

The bottom wall 113 has a plurality of (two in FIG. 1) exhaust ports 113*a*. The exhaust ports 113*a* and the exhaust device 140 are connected by an exhaust line 114. The exhaust device 140 has an APC valve and a high-speed vacuum pump capable of reducing a pressure in the inner space of the chamber 120 to a predetermined vacuum level. The high-speed vacuum pump may be a turbo molecular pump, for example. By operating the high-speed vacuum pump of the exhaust device 140, the pressure in the inner space of the chamber 120 is reduced to a predetermined vacuum level.

The plasma processing apparatus 10*a* further has a support member 122 for supporting the placing table 121 in the chamber 120, and an insulating member 123 disposed between the support member 122 and the bottom wall 113. The placing table 121 is used for placing the substrate W thereon horizontally. When the substrate W is loaded and unloaded, it is lifted by lift fins 119 raised by a lifting mechanism (not shown), and the substrate W is transferred between the transport mechanism and the stage 121. The support member 122 has a cylindrical shape extending from the center of the bottom wall 113 toward the inner space of the chamber 120. The stage 121 and the support member 122 are made of, e.g., aluminum having an alumite-treated (anodically oxidized) surface.

The plasma processing apparatus 10*a* further has a radio frequency (RF) bias power supply 125 for supplying an RF power to the stage 121, and a matching device 124 disposed between the stage 121 and the RF bias power supply 125. The RF bias power supply 125 applies an RF power to the stage 121 to attract ions to the substrate W. The matching device 124 has a circuit for matching the output impedance of the RF bias power supply 125 with the impedance of the load side (the placing table 121 side). The plasma processing apparatus 10*a* may further have a temperature control mechanism (not shown) for heating or cooling the placing table 121.

The gas supply source 131 is connected to a line 132, and the type and flow rate of a gas supplied from the gas supply source 131 are controlled by a mass flow controller and an opening/closing valve (not shown). A gas nozzle 102 extending from the line 132 has a cylindrical shape and penetrates through the ceiling wall 111. The tip end of the gas nozzle 102 is inserted into the chamber 120. The gas nozzle 102 supplies a gas or the like into the chamber 120 from a gas supply hole 102*a* at the tip end thereof.

The gas nozzle is not shown in FIG. 7. As shown in FIGS. 6 and 7, the first resonator 141 and the second resonators 142*a* to 142*f* are connected to a microwave power supply 151 via cables 152 and 153. The microwave power supply 151 distributes microwaves to a plurality of paths and outputs them. The microwave power supply 151 may have a switching part (see the switching part 47 in FIG. 2), and may switch the microwaves to a plurality of paths and output them. The first resonator 141 radiates the microwaves outputted from the microwave power supply 151 into the chamber 120 via a dielectric and a slot antenna (not shown) embedded in the ceiling wall 111.

The first resonator 141 is disposed at the center of the ceiling wall 111 that constitutes the wall surface of the chamber 120. Six second resonators 142*a* to 142*f* are evenly arranged in a peripheral area of the ceiling wall 111. The second resonators 142*a* to 142*f* may be comb-shaped resonators. The first resonator 141 may be disposed on the sidewall 112 that constitutes the wall surface of the chamber 120.

The individual components of the plasma processing apparatus 10*a* are connected to the controller 180 and controlled by the controller 180. The controller 180 may be a computer having a processor and a memory. The controller 180 includes a calculation part, a storage part, an input device, a display device, a signal input/output interface, and the like. The controller 180 controls the components of the plasma processing apparatus 10*a*.

In the plasma processing apparatus 10*a*, when microwaves with a single frequency of 860 MHz are supplied into the chamber 120, the first resonator 141 is used for igniting plasma. The second resonators 142*a* to 142*f* are used for maintaining plasma.

For example, at the time of igniting plasma, the switching part connects the microwave power source 151 and the first resonator 141 via the cable 152. At the time of maintaining plasma, the switching part connects the microwave power supply 151 and the second resonators 142*a* to 142*f* via the cable 153. Accordingly, one microwave power supply 151 can be used to supply a microwave power for plasma ignition to the first resonator 141 at the time of igniting plasma, and to supply a microwave power for plasma maintenance to the second resonators 142*a* to 142*f* at the time of maintaining plasma.

In the plasma processing apparatus 10*a*, uniform plasma processing can be performed on the substrate W by maintaining the uniformity of the plasma produced in the chamber 120. Therefore, the number of second resonators 142 is preferably three or more without being six, and may vary as long as the plasma uniformly can be maintained.

Figure 5:
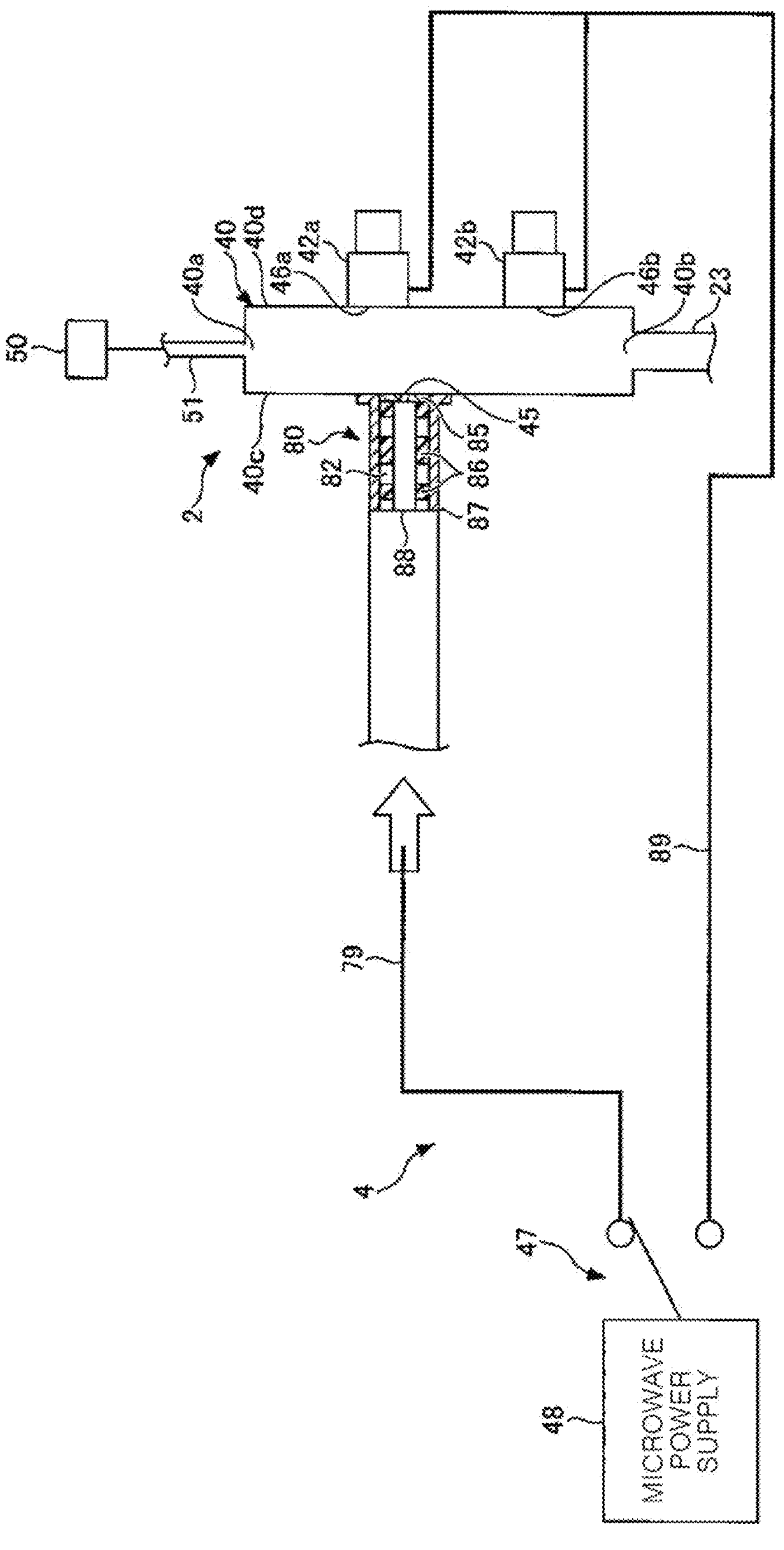
FIG. 5 shows a modification of the plasma source according to the first embodiment.

For example, the antenna part including the matching device 80 shown in FIG. 5 may be disposed at the center of the ceiling wall 111, and six second resonators 142 may be disposed in the peripheral area. When a microwave having a single frequency of 860 MHz is supplied into the chamber 120, the matching device 80 of the antenna part matches the impedance at the time of igniting plasma. After ignition, the matching device 80 matches the impedance at the time of maintaining plasma. The second resonators 142*a* to 142*f* adjust the structural height of the second resonators 142*a* to 142*f* so that the frequency of the microwave power becomes an appropriate frequency (resonance frequency) for maintaining plasma. Accordingly, the uniformity of the plasma can be further improved by using the matching device 80 and the second resonators 142*a* to 142*f* at the time of maintaining plasma. Further, the matching device 80 of the antenna part can be used for both impedance matching at the time of igniting plasma and impedance matching at the time of maintaining plasma.

As described above, in accordance with the plasma source 2 and the plasma processing apparatuses 10 and 10*a* of the present embodiment, the plasma source can be scaled down.

It should be noted that the plasma source and the plasma processing apparatus according to the embodiment of the present disclosure are illustrative in all respects and are not restrictive. For example, in the first embodiment, the ring member 54*a* on the first resonator 41*a* side and the ring member 54*b* on the second resonator 42*a* side function as the ignition power supply ports 45*a* and 45*b*. However, the "ignition power supply port" is not limited to the ring member 54*a*, and can vary as long as it can function as a "port" capable of supplying an ignition power into the housing 40. This is the same for the maintenance power supply port. The above-described embodiment may be changed or modified in various forms without departing from the scope of the appended claims and the gist thereof. The above-described embodiment may include other configurations without contradicting each other and may be combined without contradicting each other.

The invention claimed is:

1. A plasma source comprising:

a housing that defines a plasma generation space;

a gas inlet port disposed in the housing to introduce a gas;

a supply port disposed in the housing to supply active species of plasma produced from the gas in the plasma generation space;

an ignition power supply port disposed in the housing to supply a radio-frequency (RF) power for igniting the plasma in the plasma generation space; and a maintenance power supply port disposed in the housing to supply the RF power for maintaining the plasma ignited in the plasma generation space, wherein the ignition power supply port is provided with a matching device or a first resonator configured to ignite the plasma, and wherein the maintenance power supply port is provided with a second resonator configured to maintain the plasma.

2. The plasma source of claim 1, wherein said maintenance power supply port includes a plurality of maintenance power supply ports, and each of the plurality of maintenance power supply ports is provided with the second resonator.

3. The plasma source of claim 1, wherein the gas inlet port and the supply port are disposed in the housing to face each other, and any one of the ignition power supply port and the maintenance power supply port is disposed on a path that connects the gas inlet port and the supply port.

4. The plasma source of claim 1, wherein the gas inlet port and the supply port are disposed in the housing to face each other, and any one of the ignition power supply port and the maintenance power supply port is disposed on a path that connects the gas inlet port and the supply port.

5. The plasma source of claim 1, wherein the gas inlet port and the supply port are disposed in the housing to face each other, and any one of the ignition power supply port and the maintenance power supply port is disposed on a path that connects the gas inlet port and the supply port.

6. The plasma source of claim 1, wherein the first resonator is a comb-shaped resonator.

7. The plasma source of claim 1, wherein the second resonator is a comb-shaped resonator.

8. The plasma source of claim 1, further comprising:

a radio-frequency (RF) power supply configured to supply an RF power for igniting the plasma and an RF power for maintaining the plasma, and the RF power supply is a fixed-frequency power supply.

9. The plasma source of claim 8, further comprising:

a switching part connected to the RF power supply and configured to switch electrical connections between the ignition power supply port and the maintenance power supply port and the RF power supply.

10. The plasma source of claim 1, wherein the ignition power supply port and the maintenance power supply port are disposed at opposing positions on the side surface of the housing.

11. A plasma processing apparatus comprising:

a plasma source;

a processing chamber that defines a plasma processing space; and a connection portion that connects the plasma source and the processing chamber, the plasma source including:

a housing that defines a plasma generation space;

a gas inlet disposed in the housing to introducing a gas;

a supply port disposed in the housing to supply activated species of plasma produced from the gas in the plasma generation space to the plasma processing chamber;

an ignition power supply port disposed in the housing to supply an RF power for igniting the plasma in the plasma generation space; and a maintenance power supply port disposed in the housing to supply an RF power for maintaining the plasma ignited in the plasma generation space, wherein the ignition power supply port is provided with a first resonator configured to ignite the plasma, and wherein the maintenance power supply port is provided with a second resonator configured to maintain the plasma.

12. A plasma processing apparatus comprising:

a processing chamber that defines a plasma processing space;

a gas supply hole supplying a gas into the processing chamber;

an ignition power supply port formed on a wall surface of the processing chamber and configured to supply a radio frequency (RF) power for igniting plasma from the gas to the plasma processing chamber;

a maintenance power supply port formed on a ceiling wall of the processing chamber and configured to supply an RF power for maintaining the plasma ignited in the plasma processing chamber;

a first resonator or a matching device disposed at the ignition power supply port and configured to ignite the plasma; and a second resonator disposed at the maintenance power supply port and configured to maintain the plasma.

13. The plasma processing apparatus of claim 12, wherein the ignition power supply port is formed at a center of the ceiling wall, and the ignition power supply port is provided with the first resonator.

14. The plasma processing apparatus of claim 13, wherein said maintenance power supply port includes a plurality of maintenance power supply ports, the plurality of maintenance power supply ports are formed closer to an outer periphery of the ceiling wall compared to the ignition power supply port, and each of the plurality of maintenance power supply ports is provided with the second resonator.

15. The plasma processing apparatus of claim 12, wherein the first resonator and the second resonator are comb-shaped resonators.

16. The plasma processing apparatus of claim 13, wherein the first resonator and the second resonator are comb-shaped resonators.

* * * * *